United States Patent [19]

DiStefano et al.

[11] Patent Number: 4,970,106
[45] Date of Patent: Nov. 13, 1990

[54] THIN FILM MULTILAYER LAMINATE INTERCONNECTION BOARED

[75] Inventors: Thomas H. DiStefano, Bronxville; Scott G. Ehrenberg, Fishkill, both of N.Y.

[73] Assignee: International Business Machines Corporation, Armonk, N.Y.

[21] Appl. No.: 501,073

[22] Filed: Mar. 28, 1990

Related U.S. Application Data

[62] Division of Ser. No. 360,492, Jun. 2, 1989, Pat. No. 4,933,045.

[51] Int. Cl.$^5$ .......................... B44C 1/22; C23F 1/02; B32B 3/00; B32B 7/00
[52] U.S. Cl. .................................... 428/209; 156/634; 156/656; 156/902; 428/901
[58] Field of Search ............... 156/629, 630, 634, 644, 156/645, 656, 659.1, 666, 668, 902; 29/846, 852; 174/68.5; 361/397, 412, 414; 428/209, 458, 601, 901; 427/97; 204/15

[56] References Cited

U.S. PATENT DOCUMENTS 4,622,058 11/1986 Leary-Renick et al. ....... 156/643 X

Primary Examiner—William A. Powell
Attorney, Agent, or Firm—Philip J. Feig

[57] ABSTRACT

A method of assembling a multilayer laminate interconnection board, particularly boards in which each layer preferably includes copper conductors on polyimide film layers, involves adhesively joining individual layers of wired film initially onto an auxiliary pin carrier substrate and then onto a previously laminated layer. After each layer is aligned and adhesively joined to the immediately preceeding layer, holes are formed through the layer. Metal is deposited into the holes for electrically connecting conductors on the top surface of the last layer to a via located on the immediately preceeding layer. The process is repeated for each layer of the multilayer laminate interconnection board until the entire board is completely assembled. Alternatively, layers containing preformed and metalized holes at the location of a respective via in a particular layer are aligned and adhesively laminated.

15 Claims, 3 Drawing Sheets

THIN FILM MULTILAYER LAMINATE INTERCONNECTION BOARED

This application is a division of application Ser. No. 07/360,492 filed June 2, 1989, U.S. Pat. No. 4,933,045.

BACKGROUND OF THE INVENTION

This invention relates to a method of assembling a multilayer laminate interconnection board.

Until recently, the preferred interconnection scheme used in assembling mainframe computer printed circuit boards was moybdenum conductors buried in a sintered aluminum oxide substrate. More recently, such circuit boards contain copper conductors buried in a glass ceramic substrate.

There are inherent limitations regarding the use of such ceramic substrates in semiconductor packaging. The package must provide a large quantity of low inductance, low capacitance, closely spaced connections to achieve system execution cycle times less than 10 nanoseconds.

In order to overcome these limitations, it will be necessary to form the interconnections in layers with copper or other low resistance metallic wires or conductors and encase the wires in a low dielectric constant material such as polyimide or other organic dielectric material. The wiring layers, in turn, will be assembled onto an auxiliary pin carrier substrate which provides pins for connection into a circuit board for interconnection with other boards in the computer system.

Each functional layer of the laminated structure is fabricated separately and tested before lamination. The functional layer comprises one or more layers of thin film metal conductor lines. The conductor lines are separated from a ground plane sheet of conductive metal by a layer of dielectric material. An advantage of the functional layer is that the conductive signal lines and corresponding ground plane can be fully tested before fabrication into the laminated structure comprising two or more functional layers. The testing and repair of each layer can be done without disturbing or damaging the adjacent layers. In the prior art, in which the individual thin films are fabricated sequentially, the structure is difficult to repair during fabrication without damaging the previously formed films.

One prior art method of assembling a multilayer laminate is discussed in U.S. Pat. No. 3,436,819 in which holes are drilled through multiple printed circuit board layers after lamination of each layer. When assembling more than a single layer, holes are drilled through previously drilled layers to a lower or to the bottom layer. As will become apparent, the present invention obviates the requirement of a multiplicative step of producing and connecting each layer of wiring in a serial sequence to the auxiliary pin carrier substrate.

SUMMARY OF THE INVENTION

The process of assembling a multilayer laminate interconnection board in accordance with the present invention includes the formation of each layer of required wiring on a free standing polyimide film by any one of a variety of well known metallization techniques. A first layer of wired polyimide film is laminated to the auxiliary wiring pin carrier substrate by means of a polyimide adhesive. Subsequent layers of wired polyimide film are laminated to the immediately preceeding layer by means of the polyimide adhesive. After each layer is laminated, holes are formed in the layer just laminated to the immediately preceding laminated layer. After the holes are formed, metal is deposited in the holes. The layer and the holes are aligned to allow the deposited metal to connect the top layer of wiring on the uppermost laminated layer to the wiring of the layer immediately previously laminated or to the pin carrier. The steps of laminating, forming holes, and metallizing the holes are repeated for each layer of wiring in the multilayer laminate interconnection board.

The result of practicing the present invention is a multilayer laminate interconnection board formed of copper wire on polyimide film which satisfies the performance and density requirements of the assembled module without suffering the multiplicative step of producing and connecting each layer of wiring in a serial sequence to the auxiliary wiring pin carrier substrate. During assembly each layer is connected only to the immediately preceding layer. It will be apparent that by proper alignment of the layers, electrical connection is achieved from the top layer to multiple lower layers or to the auxiliary pin carrier substrate.

A principal object of the present invention is, therefore, the provision of a process for assembling a multilayer laminate interconnection board.

Another object of the invention is the provision of a process for assembling a plurality of wired metal/organic composite film layers into a multilayer laminate interconnection board.

A further object of the invention is the provision of a process for assembling a plurality of wired metal/organic composite film layers into a multilayer laminate interconnection board where through holes are connected from a just laminated layer to the immediately preceeding laminated layer.

A still further object of the invention is the provision of a process for assembling a plurality of metal/organic composite film layers containing conductors by lamination of the layers, formation of connecting holes in each layer, and metallization of the holes, layer by layer, in order to form a multilayer laminate interconnection board.

Another object of the invention is the provision of a multilayer laminate interconnection board assembled in accordance with the process described herein.

Further and still other objects of the invention will become more clearly apparent when the following description is read in conjunction with the accompanying drawings.

DETAILED DESCRIPTION OF THE INVENTION

Figure 1:
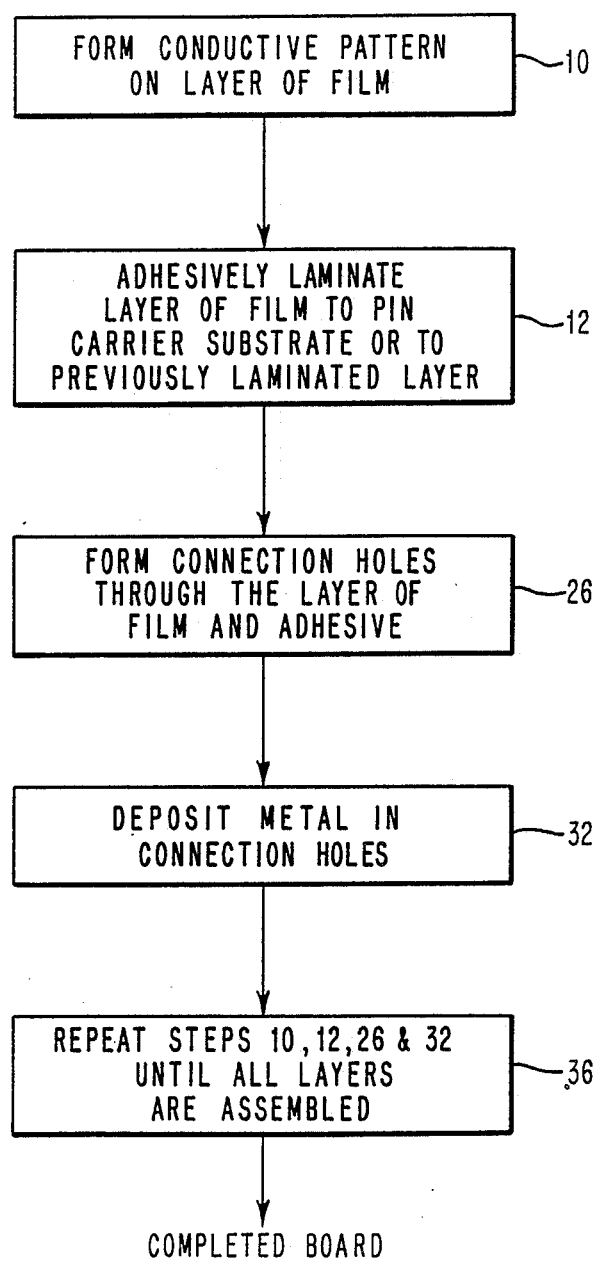
FIG. 1 is a flow diagram of the assembly process comprising the invention.

Referring now to the figures and to FIG. 1 in particular, there is shown a flow diagram of the preferred assembly process embodying the present invention.

In step 10, an individual layer comprising a laminate of the multilayer laminate interconnection board is formed by placing a desired conductor pattern including at least one through via on a free standing organic dielectric film such as Kapton. A blanket metal ground plane layer with via holes aligned with the top via structure is formed on the side of the organic film opposite the conductor pattern. The conductors may comprise copper, CrCu or any other electrically conductive material. While Kapton film is preferred, other films which are equally useful in assembling a multilayer semiconductor module may be substituted for the organic dielectric film. The metallization, or forming of the conductor pattern, is achieved by any of a variety of metallization techniques known to those skilled in the art.

The layer may be tested for open connections, short circuited paths and reliability defects for avoiding assembly of defective layers into an interconnection board which ultimately will be scraped or require work.

Figure 2:
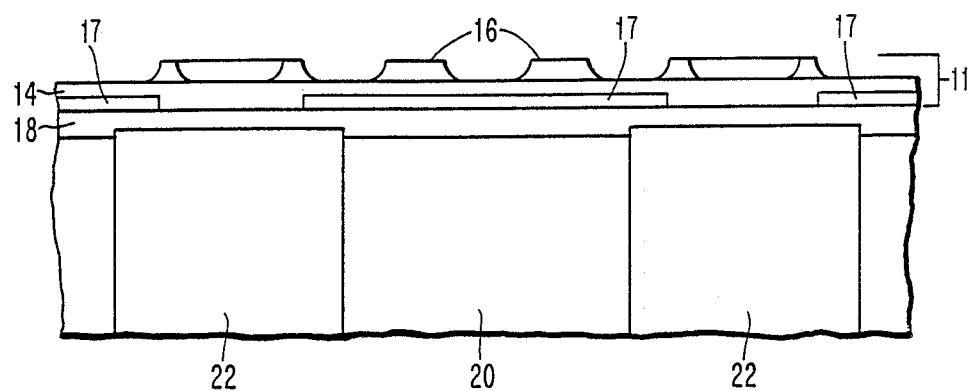
FIG. 2 is a cross-sectional view of a portion of an auxiliary wiring pin carrier substrate showing top surface vias with a single layer of prewired polyimide film.

In step 12, as shown in FIG. 2, a composite film 11 comprising a first organic dielectric layer of film 14, a pattern of conductors 16 and an asosciated conductive metal ground plane layer 17 is laminated by means of a suitable adhesive 18, such as a polyimide adhesive, onto an auxiliary wiring pin carrier substrate 20 containing one or more substrate vias 22. In the case of the first composite film layer, the bottom surface of the layer is adhesively joined to the upper surface of the auxiliary wiring pin carrier substrate 20. Additional film layers are superimposed and adhesively joined to the previously laminated layer of film as will be described in conjunction with FIG. 5.

Figure 3:
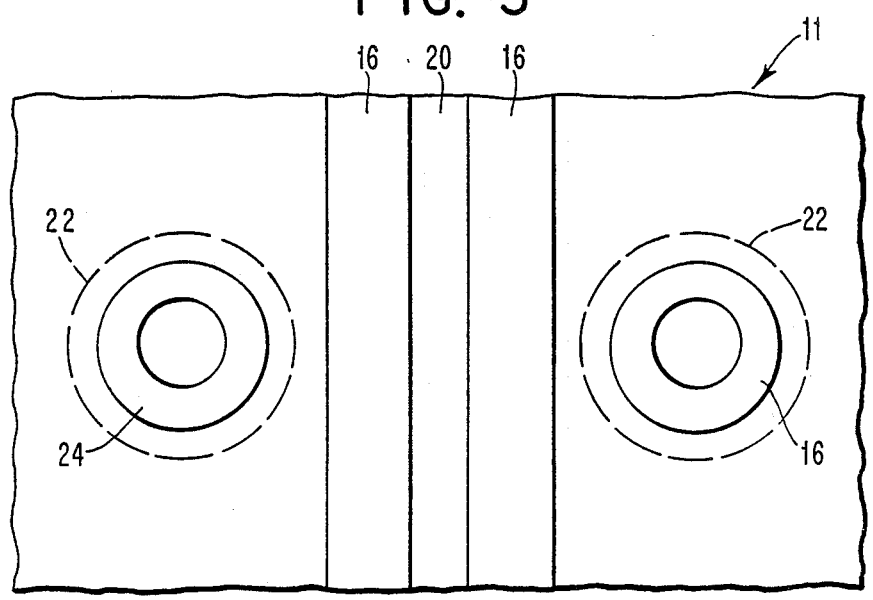
FIG. 3 is a plan view of the structure in FIG. 2.

As seen in FIG. 3, the composite film 11 is superposed and adhesively joined to the previously laminated layer or onto the carrier substrate 20 and aligned so that a via 24 contained on the composite film 11 will be in registration with a via on the previous layer or a via 22 in the carrier substrate.

Figure 4:
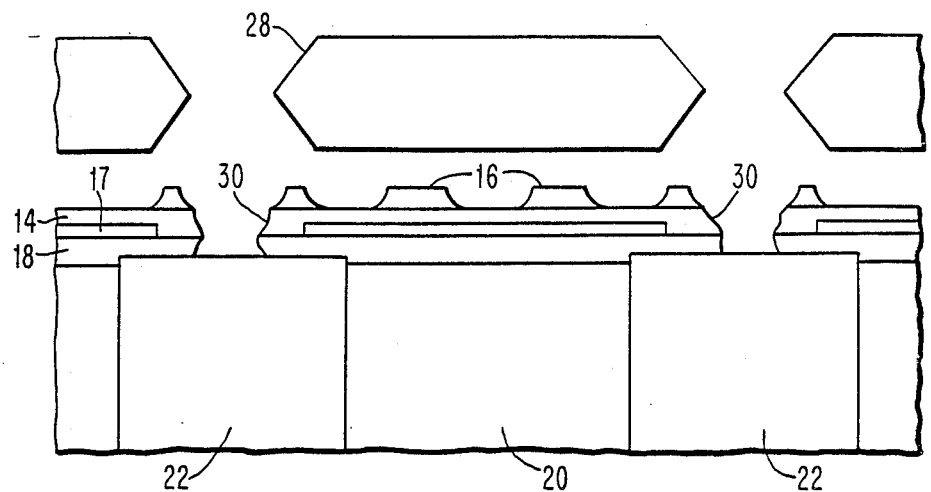
FIG. 4 is a cross-sectional view of the structure in FIG. 2 including a mask for forming an etch pattern to generate connection holes.

In step 26, after a composite film layer 11 is disposed with an adhesive layer 18 to the stack of laminated layers or to the pin carrier substrate, hole connections are formed for connecting the via from the surface of the last laminate layer to the immediately preceding laminate layer or to the auxiliary wiring pin carrier substrate in the case of the first applied layer. The connection holes are formed by known techniques of etching, laser ablating or drilling through a mask 26. The mask 26 may be a photoresist or a rigid or metallic mask. The alignment of via 24 on the layer 11 results in confinement of the etch process to a specific area. FIG. 4 depicts a metal mask 28 for forming the etch pattern to generate the connection hole 30 through polyimide film layer 14 and adhesive 18.

Figure 5:
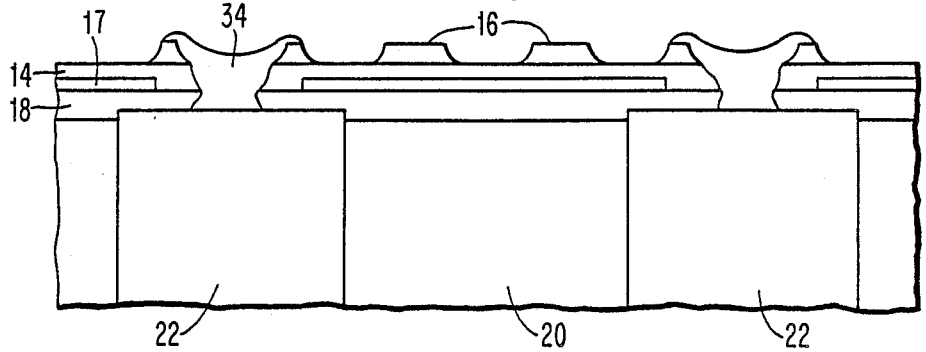
FIG. 5 is a cross-sectional view of deposited metal forming an electrical connection from the auxiliary wiring pin carrier substrate to conductors on the upper surface of a layer of polyimide film.

After the connection holes 30 in a respective layer 11 are formed, in step 32, as shown in FIG. 5, metal 34 is deposited in the hole by evaporation, sputtering or plating, such processes being well known in the art. The metal may be copper, gold or one of the known solders such as PbSn or the like.

As should be apparent to those skilled in the art, the alignment of the film layers as described above will result in the deposited metal providing a connection between the conductors on the topmost layer of film and the conductors on a film layer previously laminated or to the pin carrier substrate 20 in the case of the first layer.

In step 36, steps 10, 12, 26 and 32 are repeated for each layer to be laminated forming the multilayer laminate interconnection board.

Figure 6:
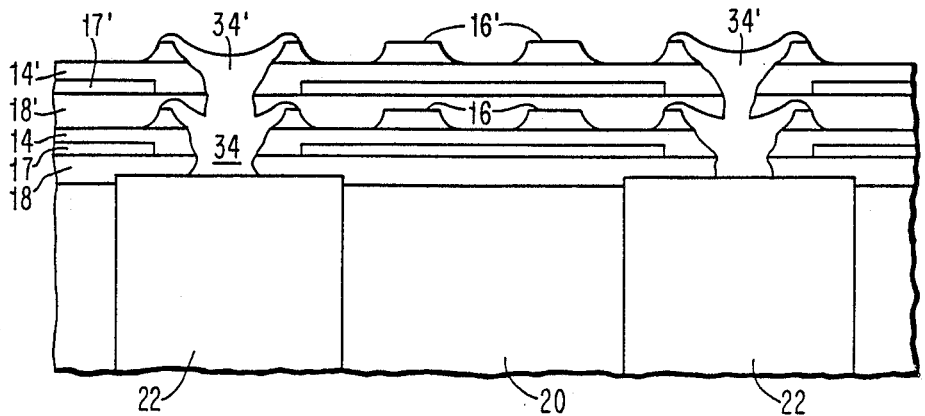
FIG. 6 is a cross-sectional view of a two layer laminate interconnection board.

FIG. 6 shows a two film layer structure in which the layers are vertically aligned as shown so that conductor 16' on the upper surface of polyimide film layer 14' is connected to the substrate via 22. It will be evident to those skilled in the art that by forming holes in each layer and then electrically connecting each layer to its immediately preceding layer, that it is possible to connect two or more layers together at predetermined via locations without connection of the top layer to the substrate vias.

An alternative process for assembling a multilayer laminate interconnection board comprises adhesively joining composite layers containing preformed and metalized holes at the location of a respective via in a particular composite layer. A respective layer is aligned and laminated onto the partial assembly of previously laminated layers.

After all the layers are assembled the final unit is tested for continuity between the conductors on the layers and the pins in the auxiliary pin carrier substrate.

While there has been described and illustrated a process for assembling a multilayer laminate interconnection board and an interconnection board assembled according to the process, it will be apparent to those skilled in the art that variations and modifications are possible without deviating from the broad principles of the invention which shall be limited solely by the scope of the claims appended hereto.

What is claimed is:

1. A multilayer laminate interconnection board including a pin carrier substrate assembled according to the process comprising the steps of:
   (a) providing a composite layer by forming a predetermined conductor pattern including at least one via and an associated conductive ground plane on a free standing layer of organic dielectric film;
   (b) laminating by adhesive said composite layer onto the pin carrier substrate, aligning a respective via in said composite layer with an associated via in the substrate;
   (c) forming a hole through said composite layer and adhesive at the location of a respective via in said layer;
   (d) depositing metal in the formed hole, and
   (e) repeating steps a to d for successive composite layers, each composite layer being superposed and aligned on an immediately preceding layer, whereby a via on a respective layer is electrically connected to a via on an immediately preceding layer.

2. A multilayer laminate interconnection board as set forth a pin carrier in claim 1, wherein said organic dielectric film is a polyimide film and said conductor pattern and said associated conductor ground plane comprise copper.

3. A multilayer laminate interconnection board as set forth in claim 1 wherein said organic dielectric film is a polyimide film.

4. A multilayer laminate interconnection board as set forth in claim 1 wherein said conductor pattern and associated conductive ground plane comprise copper.

5. A multilayer laminate interconnection board as set forth in claim 1 wherein said adhesive is a polymide adhesive.

6. A multilayer laminate interconnection board including a pin carrier substrate assembled according to the process comprising the steps of:
(a) providing a first composite layer by forming a predetermined conductor pattern including at least one via and an associated conductive ground plane on a first free standing layer of organic dielectric film;
(b) laminating by adhesive said first composite layer onto the pin carrier substrate, aligning a respective via on said first composite layer with an associated via on the substrate;
(c) forming a hole through said first composite layer and adhesive at the location of the respective via in said first composite layer;
(d) depositing metal in the formed hole;
(e) providing a second composite layer by forming a predetermined conductor pattern including at least one via on an associated conductive ground plane on a second free standing layer of organic dielectric film;
(f) laminating by adhesive said second composite layer onto said first composite layer, aligning a respective via on said second composite layer with an associated via on said first composite layer;
(g) forming a hole through said second composite layer and adhesive at the location of the respective via in said second composite layer;
(h) depositing metal in the formed hole to electrically connect the respective via on said second composite layer to the associated via on said first composite layer;
(i) providing a subsequent composite layer by forming a predetermined conductor pattern having at least one via and an associated conductive ground plane on a subsequent free standing layer of organic dielectric film;
(j) laminating by adhesive a subsequent composite layer onto a previously laminated composite layer aligning a respective via on said subsequent composite layer with an associated via on the previously laminated composite layer;
(k) forming a hole through said subsequent composite layer and adhesive at the location of the respective via on said subsequent composite layer;
(l) depositing metal in the formed hole to electrically connect the via on said subsequent composite layer to the via on the previously laminated composite layer, and
(m) repeating steps (i) through (l) for each composite layer in the multilayer laminate interconnection board.

7. A multilayer laminate interconnection board including a pin carrier substrate as set forth in claim 6, wherein said organic dielectric film is a polyimide film and said conductor pattern and associated conductive ground plane comprise copper.

8. A multilayer laminate interconnection board as set forth in claim 6 wherein said organic dielectric film is a polyimide film.

9. A multilayer laminate interconnection board as set forth in claim 6 wherein said conductor pattern and associated conductive ground plane comprise copper.

10. A multilayer laminate interconnection board as set forth in claim 6 wherein said adhesive is a polyimide adhesive.

11. A multilayer laminate interconnection board including a pin carrier substrate assembled according to the process comprising the steps of:
(a) providing a first composite layer by forming a predetermined conductor pattern including at least one via and an associated conductive ground plane on a free standing layer of organic dielectric film;
(b) laminating by adhesive said first composite layer onto the pin carrier substrate, aligning a respective via on said first composite layer with an associated via on the substrate;
(c) providing a subsequent composite layer by forming a predetermined conductor pattern having at least one via and an associated conductive ground plane on a subsequent free standing layer of organic dielectric film;
(d) laminating by adhesive a subsequent composite layer onto a previously laminated composite layer aligning a respective via on said subsequent composite layer with an associated via on the previously laminated composite layer, and
(e) repeating step (d) for each composite layer in the multilayer laminate interconnection board.

12. A multilayer laminate interconnection board as set forth in claim 11, wherein said organic dielectric film is a polyimide film and said conductor pattern and said associated conductive ground plane comprise copper.

13. A multilayer laminate interconnection board as set forth in claim 11 wherein said organic dielectric film is a polyimide film.

14. A multilayer laminate interconnection board as set forth in claim 11 wherein said conductor pattern and associated conductive ground plane comprise copper.

15. A multilayer laminate interconnection board as set forth in claim 11 wherein said adhesive is a polyimide adhesive.

* * * * *